United States Patent
Nakayama (10) Patent No.: US 7,031,358 B2
(45) Date of Patent: Apr. 18, 2006

(54) SEMICONDUCTOR LASER DRIVING APPARATUS

(75) Inventor: Kunio Nakayama, Tokyo (JP)

(73) Assignee: Sony Disc & Digital Solutions Inc., Tokyo (JP)

( * ) Notice: Subject to any disclaimer, the term of this patent is extended or adjusted under 35 U.S.C. 154(b) by 221 days.

(21) Appl. No.: 10/727,608

(22) Filed: Dec. 5, 2003

(65) Prior Publication Data

US 2004/0109482 A1   Jun. 10, 2004

(30) Foreign Application Priority Data

Dec. 6, 2002   (JP)   ............... 2002-354883

(51) Int. Cl.
*H01S 3/00*   (2006.01)
(52) U.S. Cl. ............... 372/38.02; 372/50.12; 372/38.1; 372/38.07; 372/29.01; 372/29.15; 372/26
(58) Field of Classification Search .............. 372/26, 372/38.02, 38.1, 38.07, 29.01, 29.011, 29.015, 372/50.12

See application file for complete search history.

(56) References Cited

U.S. PATENT DOCUMENTS

| | | | | |
|---|---|---|---|---|
| 5,287,375 A | * | 2/1994 | Fujimoto | .................. 372/38.02 |
| 6,111,901 A | * | 8/2000 | Taguchi et al. | .......... 372/38.02 |
| 2003/0227950 A1 | * | 12/2003 | Oomori | ........................ 372/34 |
| 2004/0240495 A1 | * | 12/2004 | Akamatsu | .................... 372/32 |
| 2005/0030985 A1 | * | 2/2005 | Diaz et al. | ............. 372/29.015 |

* cited by examiner

*Primary Examiner*—Minsun Oh Harvey
*Assistant Examiner*—Delma R. Flores-Ruiz
(74) *Attorney, Agent, or Firm*—Oblon, Spivak, McClelland, Maier & Neustadt, P.C.

(57) ABSTRACT

A laser beam is obtained from a semiconductor laser by a stable emission light amount. A first semiconductor laser is thermally coupled with a second semiconductor laser and driven by a feedback circuit constructed by a photodetector, an I-V converter, and a current generator so as to stabilize the emission light amount. A current $I_0'$ having a correlation with a drive current $I_0$ of the 1st laser is outputted from a current mirror circuit. A modulation signal is supplied to a current pull-in type current driving circuit via a multiplier and a linearity compensating circuit and a current $I_2$ according to the modulation signal is extracted from a collector of a transistor. The 2nd laser is driven by a current $I_1$ ($I_0'-I_2$) and a laser beam modulated by the modulation signal is generated. Since the signal modulation by the 2nd laser is performed without influencing on $I_0$ and the 2nd laser is driven by $I_0'$, the emission light amount is stabilized.

8 Claims, 9 Drawing Sheets

Fig. 8A  BURST SIGNAL

Fig. 8B  LIGHT OUTPUT AT HIGH TEMPERATURE

Fig. 8C  LIGHT OUTPUT AT ROOM TEMPERATURE

Fig. 8D  LIGHT OUTPUT AT LOW TEMPERATURE

SEMICONDUCTOR LASER DRIVING APPARATUS

BACKGROUND OF THE INVENTION

1. Field of the Invention

The invention relates to a semiconductor laser driving apparatus for driving a semiconductor laser for modulating an electric signal into a photosignal based on a laser beam and outputting the modulated photosignal.

2. Description of the Related Arts

Hitherto, at the time of a mastering process of a CD (Compact Disc) or a DVD (Digital Versatile Disc), a master disc has been cut by a gas laser using an argon gas or a krypton gas.

Figure 4:
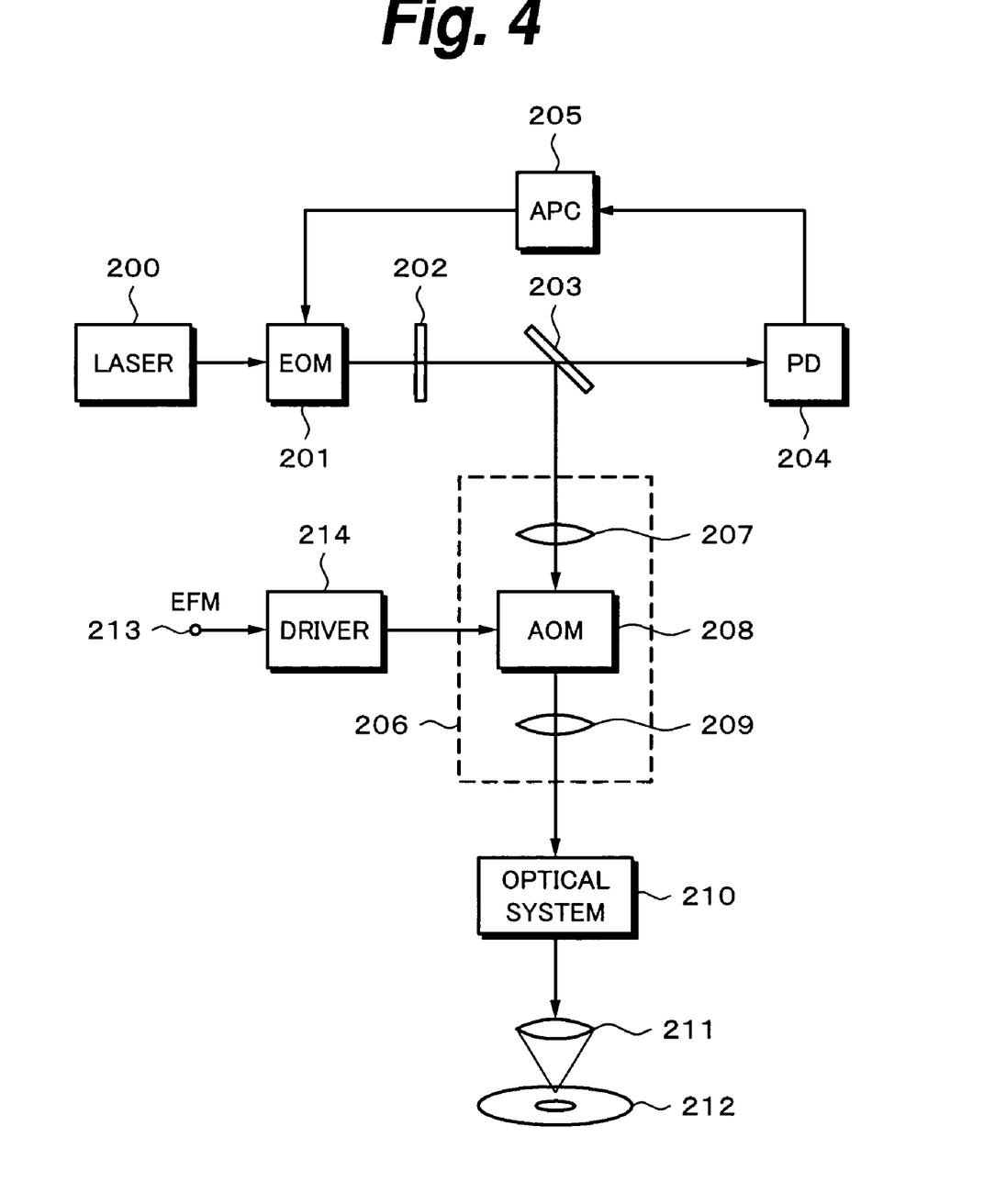
FIG. 4 is a block diagram schematically showing a construction of an example of a cutting apparatus using a gas laser.

FIG. 4 schematically shows a construction of an example of a cutting apparatus using the gas laser. In the cutting apparatus, a photoresist (not shown) coated on a glass substrate 212 is exposed, a latent image is formed on the photoresist, and the cutting is performed. A light source 200 is a gas laser. For example, the gas laser for emitting a laser beam of a short wavelength such as Kr laser for emitting a laser beam having a wavelength λ of 351 nm or an He—Cd laser for emitting a laser beam having a wavelength λ of 442 nm is preferable.

The laser beam emitted from the light source 200 is first converted into the laser beam having predetermined light intensity by an EOM (Electro Optical Modulator) 201 which is driven by a signal electric field that is applied from an APC (Auto Power Controller) 205 and, thereafter, the laser beam is inputted to an analyzer 202. The analyzer 202 is an analyzer for transmitting only an S polarization. The laser beam which transmitted the analyzer 202 becomes the S polarization.

The laser beam emitted from the analyzer 202 transmits a beam splitter 203 and is inputted to a photodetector (PD) 204. In the photodetector (PD) 204, the light intensity of the incident laser beam is detected and a signal corresponding to the light intensity is supplied from the photodetector 204 to the APC 205. The APC 205 adjusts the signal electric field which is applied to the EOM 201 so that the light intensity which is detected by the photodetector 204 becomes constant at a predetermined level. Thus, feedback control is made so that the light intensity of the laser beam which is emitted from the EOM 201 becomes constant.

The laser beam emitted from the light source 200 is reflected by the beam splitter 203 and is inputted to a modulation optical system 206. In the modulation optical system 206, for example, a beam relay optical system comprising, for example, lenses 207 and 209 and an AOM (Acoust Optic Modulator) 208 between them are arranged so as to satisfy a Bragg condition. In the beam relay optical system, they are arranged so that the laser beam emitted from the light source 200 is concentrated on the AOM 208 by using the condenser lens 207.

An EFM (Eight to Fourteen Modulation) signal inputted to a terminal 213 is supplied to a driver 214 and modulated to an ultrasonic wave. The ultrasonic wave is supplied from the driver 214 to the AOM 208. The laser beam inputted to the AOM 208 is modulated on the basis of the ultrasonic wave supplied from the driver 214.

The laser beam modulated in the AOM 208 on the basis of the EFM signal is inputted to an optical system 210 via the lens 209 and converged onto a surface of the disc 212 by an objective lens 211. Thus, the cutting is performed to the disc 212 on the basis of the EFM signal supplied from the terminal 213. In the AOM 208, by bending an optical path of the emitted laser beam by using diffraction of the light, the on/off of the laser beam which is irradiated onto the disc 212 is controlled, thereby performing the cutting.

The intensity or the like of the laser beam which is irradiated onto the surface of the disc 212 needs to be controlled in accordance with a type of disc 212 as a cutting target (for example, whether the disc 212 is a CD or a DVD), a cutting speed, or the like. In the conventional cutting apparatus using the gas laser, a power has uniformly been determined every type of disc and every cutting speed as mentioned above and the cutting is performed. In such conditions, the foregoing on/off control of the laser beam by the AOM 208 has been made.

The gas laser (light source 200) and AOM 208 used in the cutting apparatus according to the prior art have drawbacks such that they are expensive, durability is low, a shape is large, and the like. Therefore, it is demanded to construct the cutting apparatus by a semiconductor laser as a laser device which can solve those drawbacks. In recent years, also in the semiconductor laser, the semiconductor laser which can emit a laser beam of a short wavelength has appeared. By using the semiconductor laser which can emit the laser beam of the short wavelength as a light source, a miniaturized cutting apparatus of low costs can be constructed in place of the cutting apparatus using the gas laser and the AOM.

The semiconductor laser is also used as a light source of light communication besides the foregoing cutting apparatus. The semiconductor laser is driven by a modulation current modulated on the basis of digital data which is transmitted by communication and the emitted laser beam is irradiated, for example, into an optical fiber. The laser beam is received by a photodetector on the light receiving side and an obtained output current is decoded and becomes digital data.

Hitherto, the semiconductor laser is also used in an optical disc recording and reproducing apparatus for recording data onto a recordable optical disc and reproducing the data recorded on the optical disc. A semiconductor laser driving circuit which can be applied to an optical recording and reproducing apparatus for executing the recording and reproduction to/from an optical recording medium has been disclosed in JP-A-63-197037.

A method of adjusting an emission light amount of the semiconductor laser according to the prior art will be schematically explained. Hitherto, the APC and the signal modulating circuit have been assembled in the same loop and one semiconductor laser has been driven. While the APC stabilizes the emission light amount, the signal modulating circuit changes the emission light amount. If those two circuits which execute such opposite operations are assembled in the same loop, for example, when an operating frequency of the APC and a frequency of the modulation signal lie within the same frequency band, the modulation signal is cancelled by the operation of the APC, the emission light amount is set to be constant, and a light modulation signal cannot be obtained.

Figure 5:
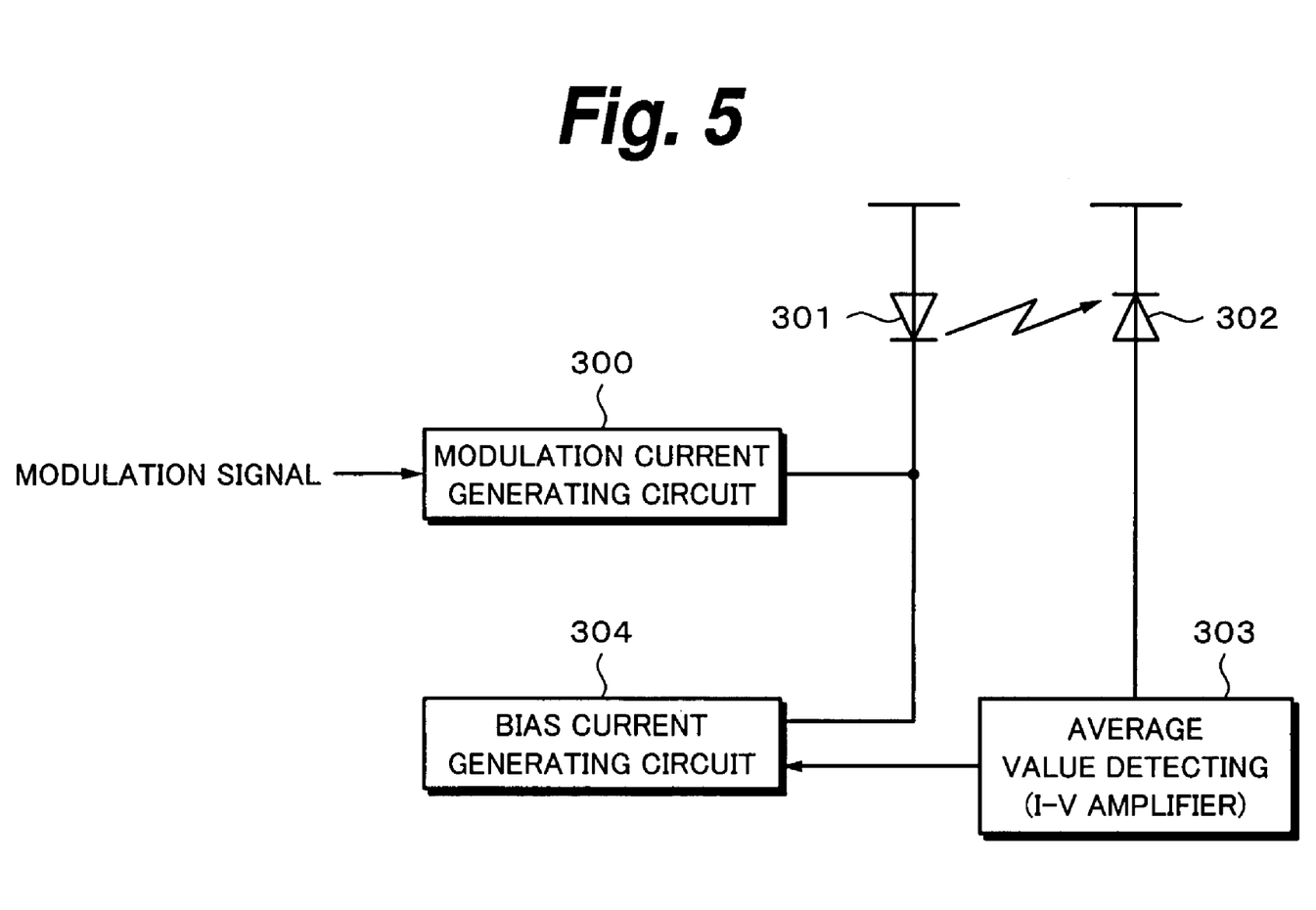
FIG. 5 is a block diagram showing a construction of an example of a semiconductor laser driving circuit according to the prior art.

Therefore, hitherto, for example, by a circuit construction as shown as an example in FIG. 5, an average value of an output from a semiconductor laser 301 is obtained and the APC operation is executed at a frequency which is equal to or lower than hundreds of kHz.

That is, in FIG. 5, the semiconductor laser 301 is driven by a modulation current generated from a modulation current generating circuit 300 on the basis of an EFM signal as a modulation signal. A photodetector 302 receives a laser beam emitted from the semiconductor laser 301 and generates an output current according to the received laser beam.

The output current of the photodetector 302 is supplied to an average value detecting circuit 303 and converted into a voltage value. At the same time, for example, it is integrated, an average value is detected, and a bias current is generated from a bias current generating circuit 304 on the basis of the detected average value. The bias current is added to the modulation current for the semiconductor laser, so that the intensity of the laser beam which is outputted from the semiconductor laser 301 is controlled.

Figure 6:
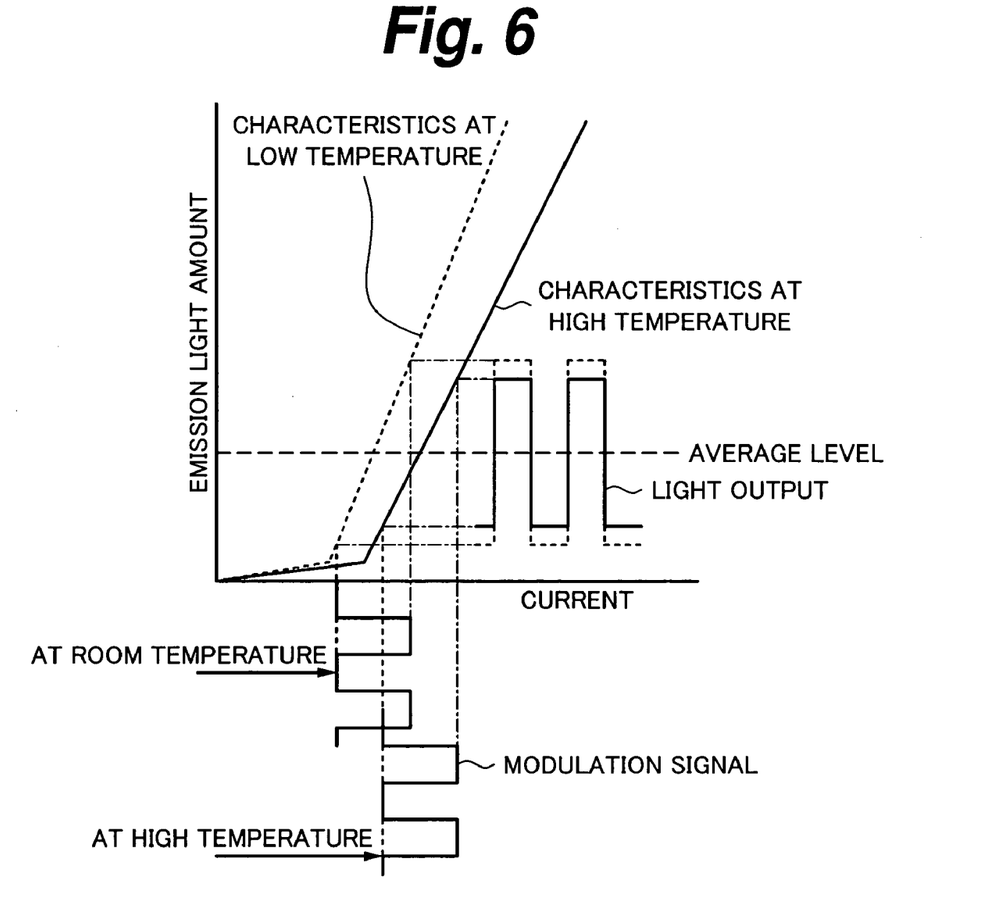
FIG. 6 is a diagram for explaining that an extinction ratio of an emission light amount changes by an influence of a temperature change of the semiconductor laser itself.

In the example of FIG. 5, the APC operation for the semiconductor laser 301 is executed by controlling only the bias current which is applied to the semiconductor laser 301. According to such a method, however, as shown in an example in FIG. 6, there is a problem such that an extinction ratio (a difference between a light level upon light emission and a light level upon light extinction) of the emission light amount changes due to an influence by a temperature change of the semiconductor laser 301 itself. That is, when the temperature of the semiconductor laser 301 itself rises by the continuous driving, the emission light amount of the semiconductor laser 301 decreases. To compensate the decrease in emission light amount, the bias current to the semiconductor laser 301 is increased, so that the light level upon light extinction rises.

There is a problem such that when a duty ratio of the modulation signal changes, the average value of the output current according to the light reception of the laser beam to the photodetector 302 which is detected by the average value detecting circuit 303 changes, so that the emission light amount of the semiconductor laser 301 itself changes.

Figure 7:
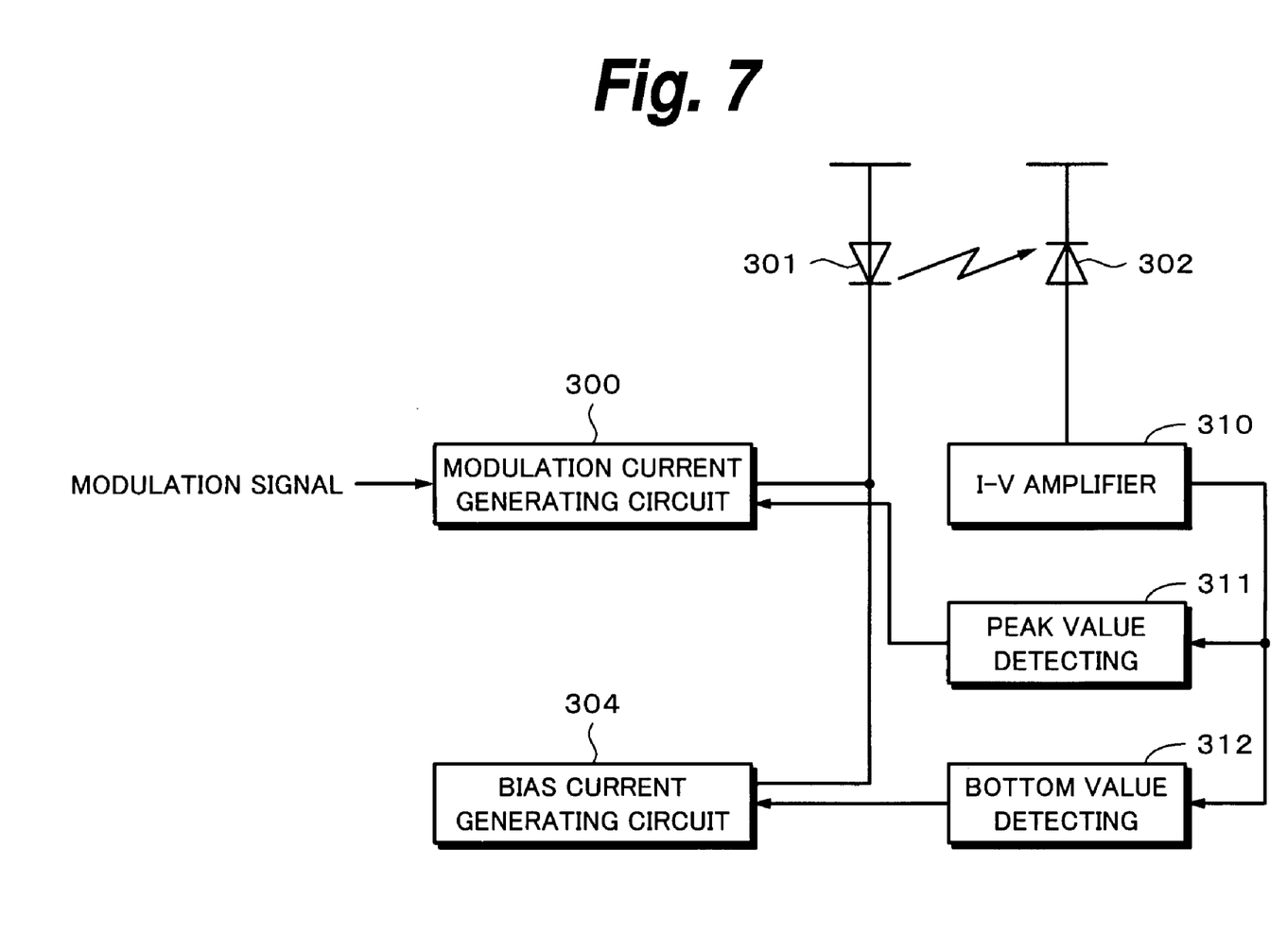
FIG. 7 is a block diagram showing a construction of an example of a semiconductor laser driving circuit according to the prior art.

To solve such a problem, as shown in an example in FIG. 7, there is a method whereby a peak value and a bottom value of a feedback signal based on the output current of the photodetector 302 are sampled and held, respectively, the loop is temporarily shut off, and the APC operation is executed.

That is, in FIG. 7, the output current of the photodetector 302 is converted into a voltage value by an I-V amplifier 310. The voltage value is sampled at regular intervals by a peak value detecting circuit 311 and a bottom value detecting circuit 312 and a peak value and a bottom value are detected, respectively. The bias current is generated from the bias current generating circuit 304 on the basis of the bottom value detected by the bottom value detecting circuit 312. The maximum value of the modulation current is controlled in the modulation current generating circuit 300 on the basis of the peak value detected by the peak value detecting circuit 311.

Figure 8A:
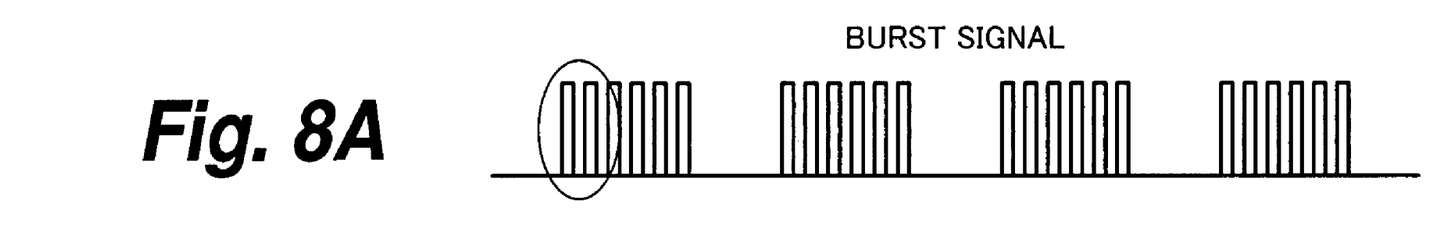
FIGS. 8A to 8D are schematic diagrams for explaining that a modulation signal is inputted in a burst manner.

According to such a method, for example, in light communication or the like using the foregoing semiconductor laser, as shown in an example in FIG. 8A, an interval with the signal and an interval without the signal exist alternately. There is a possibility that when a burst signal is supplied as a modulation signal, a problem occurs. That is, in this case, there is a problem such that when a signal state changes from the non-signal interval to the signal existing interval, it takes a time until the output reaches a predetermined emission output.

Figure 8B:
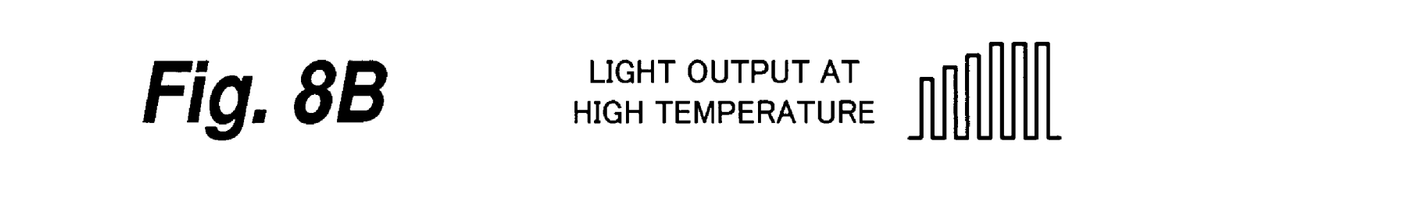
Figure 8C:
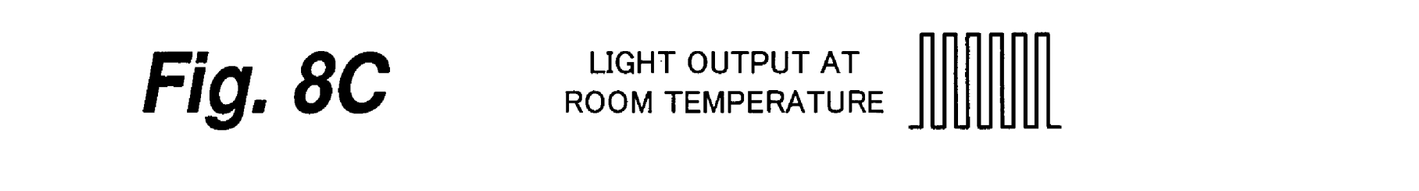
Figure 8D:
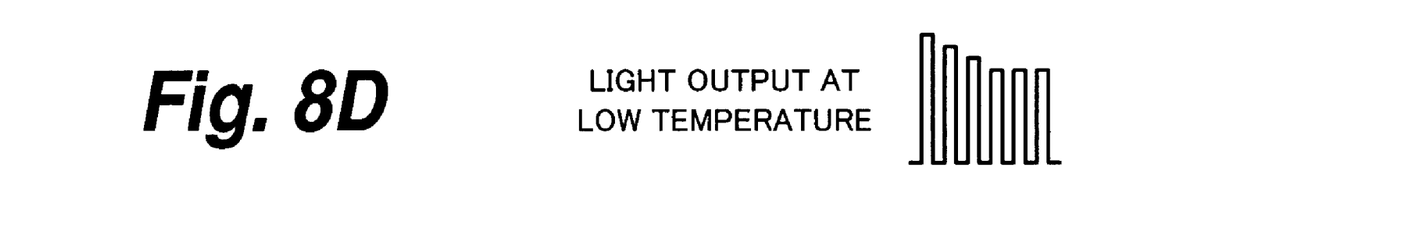

For example, at a temperature (room temperature) which is suitable as an operating temperature of the semiconductor laser 301, as shown in FIG. 8C, the laser beam output of a predetermined emission light amount is obtained from the head of the signal existing interval. However, there is a problem such that at a high temperature or a low temperature, since the emission light amount is corrected every sampling intervals with respect to the emission output of the semiconductor laser 301 at such a temperature, it takes a long time until the laser beam output of the proper emission light amount is obtained as shown in FIGS. 8B and 8D.

In recent years, however, a technique for displaying arbitrary characters or pictures onto the recording surface side of the CD or DVD has been proposed. Such a technique uses a principle such that, for example, if a pit which is formed in a certain range on the recording surface is formed in a size smaller than a specified size, when the user observes the recording surface of the disc, such a portion is seen unlike a portion where an ordinary pit has been formed. For example, since the light is easily irregularly reflected by the portion where the pit smaller than the specified size has been formed, such a portion is seen in whitish as compared with the portion where the ordinary pit has been formed. By controlling a pit width on the basis of data constructed so as to display a predetermined character pattern or pictures onto the disc surface, the disc such that the characters or pictures have been displayed on the recording surface side can be formed. The characters or pictures displayed on the recording surface side of the disc are referred to as a "watermark" hereinafter.

If the pit is formed in a size smaller than the specified size, an error rate deteriorates in such a portion upon reproduction. Therefore, for example, correcting means for preventing the deterioration of the error rate by a method whereby a length of portion corresponding to the pit of the recording signal is corrected so that a length of pit is equal to a specified length (actually, it is set to be longer), the length of pit is held at the specified length, and the width is narrowed, or the like is used.

The pit smaller than the specified size can be formed by a method whereby, for example, a power of the laser beam which is irradiated onto the surface of the disc 212 is set to be smaller than that in the case of forming the pit in the specified size at the time of cutting when a master disc is formed.

Figure 9:
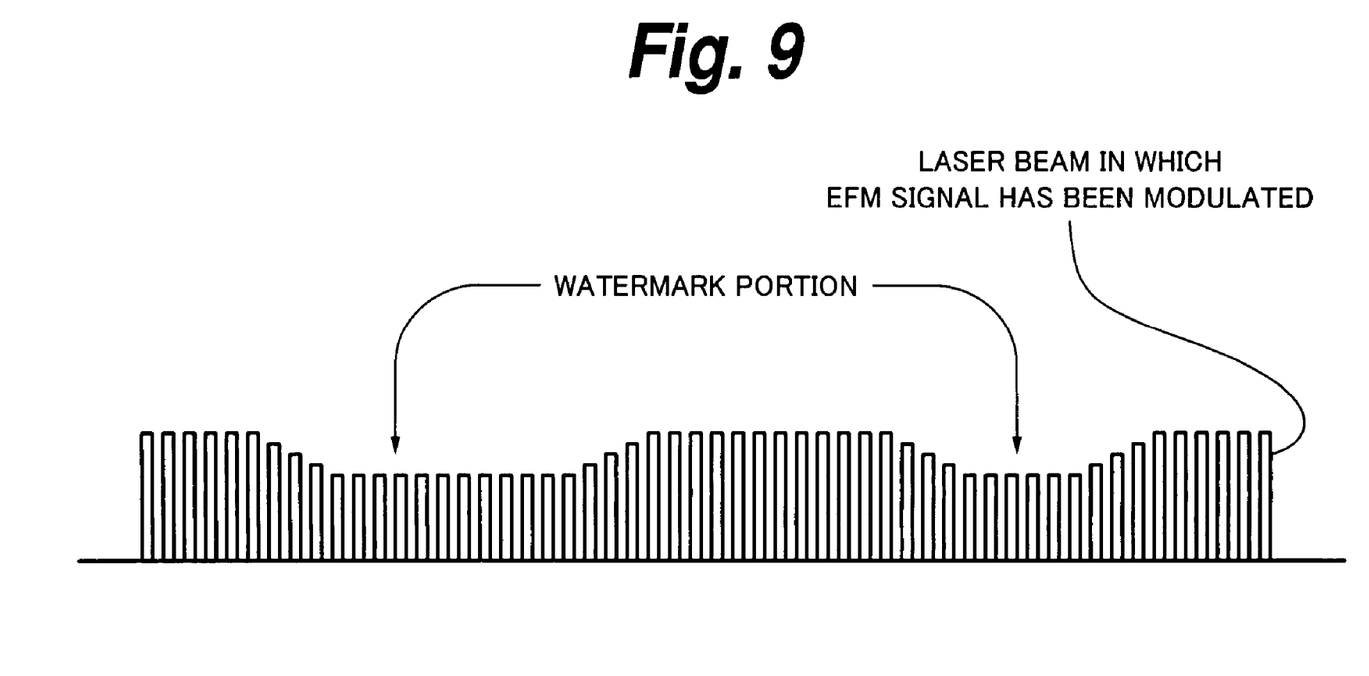
FIG. 9 is a diagram schematically showing an example of an emission output of a laser beam at the time of recording a watermark.

FIG. 9 schematically shows an example of an emission light amount in the laser beam output at the time of recording the watermark. When the watermark is recorded, control is made in a manner such that the emission light amount of the laser beam output decreases in the portion corresponding to the watermark, that is, in the portion where the pit smaller than the specified size is formed. If the emission light amount is not controlled so as to be constant in the whole area corresponding to the watermark, the display of the watermark fluctuates.

There is a problem such that the control such that a peak light amount of the emission light changes continuously as mentioned above is difficult to be realized by the conventional control method as mentioned above for the semiconductor laser 301.

Hitherto, in the semiconductor laser, the emission light has been modulated by a signal which reciprocates at the maximum and minimum values whose outputs have been set, for example, by a rectangular wave signal and it is difficult to modulate the emission light of the semiconductor laser by the intermediate value of the maximum value and the minimum value.

OBJECTS AND SUMMARY OF THE INVENTION

It is, therefore, an object of the invention to provide a semiconductor laser driving apparatus which can obtain a laser beam of a stable emission light amount from a semiconductor laser.

Another object of the invention is to provide a semiconductor laser driving apparatus which can be driven even by a modulation signal having an intermediate value.

According to a preferred aspect of the invention, the above objects are accomplished by a semiconductor laser driving apparatus for modulating an output laser beam of a semiconductor laser on the basis of a modulation signal and outputting the modulated laser beam, comprising: a first semiconductor laser; first driving means for controlling a first drive current of the first semiconductor laser on the basis of the output laser beam of the first semiconductor laser so that an emission light amount of the output laser beam becomes almost constant; a second semiconductor laser thermally coupled with the first semiconductor laser; and second driving means for driving the second semiconductor laser by a second drive current obtained by subtracting a current corresponding to the modulation signal for modulating the output laser beam of the second semiconductor laser from a current having a correlation with the first drive current.

As described above, according to the invention, since the second semiconductor laser is driven by the second drive current obtained by subtracting the current corresponding to the modulation signal for modulating the output laser beam of the second semiconductor laser thermally coupled with the first semiconductor laser from the current having the correlation with the first drive current of the first semiconductor laser controlled on the basis of the output laser beam of the first semiconductor laser so that the emission light amount of the output laser beam becomes almost constant, the second semiconductor laser can be stably driven without being influenced by the modulation signal.

The above and other objects and features of the present invention will become apparent from the following detailed description and the appended claims with reference to the accompanying drawings.

DETAILED DESCRIPTION OF THE PREFERRED EMBODIMENTS

The first embodiment of the invention will be described hereinbelow. An apparatus according to the invention has: a first semiconductor laser which receives a feedback of its own emission light amount and whose emission light amount is controlled on the basis of a signal serving as a reference; and a second semiconductor laser which is thermally coupled with the first semiconductor laser and driven on the basis of a modulation signal, wherein the second semiconductor laser is driven on the basis of a drive current of the first semiconductor laser.

Figure 1:
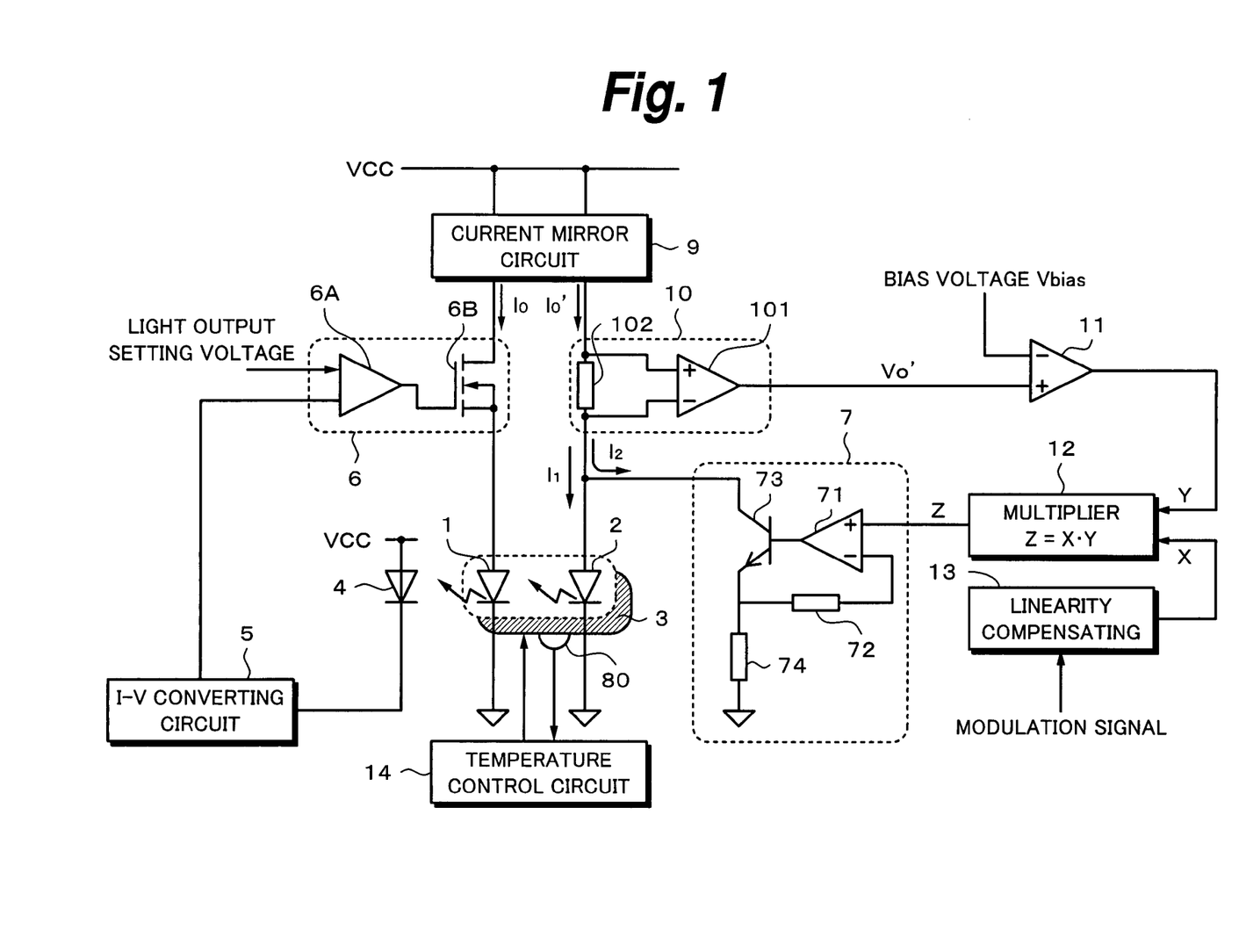
FIG. 1 is a circuit diagram showing a construction of an example of a semiconductor laser driving apparatus according to the first embodiment of the invention.

FIG. 1 shows a construction of an example of a semiconductor laser driving apparatus according to the first embodiment of the invention. A laser beam emitted from a semiconductor laser 1 is received by a photodetector 4 and an output current according to the received laser beam is generated. The output current is converted into a voltage value by an I-V converting circuit 5. The converted voltage value is supplied to a current generating circuit 6. A light output setting voltage for setting an emission light amount of the semiconductor laser 1 is also supplied to the current generating circuit 6.

The current generating circuit 6 is constructed by, for example, an arithmetic operation unit 6A and an FET (Field Effect Transistor) 6B and converts a voltage value due to a difference between a value of a voltage supplied from the I-V converting circuit 5 and a value of a light output setting voltage which is supplied from, for example, the outside into a current $I_0$. The semiconductor laser 1 is driven by the current $I_0$. That is, the semiconductor laser 1 is driven and controlled by a feedback loop constructed by the photodetector 4, I-V converting circuit 5, and current generating circuit 6 so that the emission light amount becomes almost constant in accordance with the value of the light output setting voltage. In the current generating circuit 6, a general transistor can be used in place of the FET 6B.

The value of the light output setting voltage which is supplied to the current generating circuit 6 is set in accordance with an application of the semiconductor laser driving apparatus so that a desired laser beam output can be obtained. For example, when the semiconductor laser driving apparatus is used for the cutting apparatus of a CD or a DVD, a proper value can be uniformly set every media serving as a target. If the laser beam output of the semiconductor laser 1 has a predetermined value, the light output setting voltage can be set to a fixed value without supplying it from the outside. In this case, the laser beam output of the semiconductor laser 1 can be adjusted by adjustment of the light amount of the laser beam which is inputted to the photodetector 4 from the semiconductor laser 1 or gain control in the I-V converting circuit 5 and/or the current generating circuit 6.

A current mirror circuit 9 outputs a current $I_0'$ having a correlation with the current $I_0$. The current $I_0'$ is supplied to a semiconductor laser 2 and a current driving circuit 7 via a current detecting resistor 102. A current which is supplied to the semiconductor laser 2 is assumed to be a current $I_1$ and a current which is supplied to the current driving circuit 7 is assumed to be a current $I_2$, respectively. In this case, current $I_0'$=current $I_1$+current $I_2$ and the semiconductor laser 2 is driven by the current $I_1$.

It is desirable that electric characteristics of the semiconductor lasers 1 and 2 are almost equal. The semiconductor lasers 1 and 2 are thermally coupled so that their electric operation points almost coincide. For example, the semiconductor lasers 1 and 2 can be thermally coupled by mounting the semiconductor lasers 1 and 2 onto a mounter 3 made of the same metal in a state of good thermal conductivity.

As shown in FIG. 1, it is also possible to construct the apparatus in a manner such that a temperature sensor 80 is provided for the mounter 3 and a temperature of the mounter 3 and/or temperatures of the semiconductor lasers 1 and 2 is/are controlled by a temperature control circuit 14 on the basis of a detection result of the temperature sensor 80. The temperature control is made by the temperature control circuit 14 by using a device which can electrically control the temperature, for example, by using a Peltier device, a thermistor, or the like. It is preferable to make the temperature control by absorbing heat from a control target.

The invention is not limited to such a construction but can be also constructed in a manner such that temperature sensors are provided for the semiconductor lasers 1 and 2 and the temperature control is made so that the temperatures of the semiconductor lasers 1 and 2 correspond to each other, thereby thermally coupling the semiconductor lasers 1 and 2. According to such a method, the semiconductor lasers 1 and 2 can be arranged in positions which are away from each other.

In a current monitor circuit 10, a potential difference across the resistor 102 is detected by a potential difference detecting circuit 101 and the current $I_0'$ is converted into a voltage value. A voltage value $V_0'$ converted from the current $I_0'$ and a bias voltage $V_{bias}$ are supplied to an arithmetic operation unit 11. A difference between the voltage value $V_0'$ and the bias voltage $V_{bias}$ is outputted from the arithmetic operation unit 11. Such a differential voltage value is inputted to an input terminal Y of a multiplier 12.

For example, a modulation signal as an EFM signal is inputted to a linearity compensating circuit 13. The linearity compensating circuit 13 is a circuit to compensate non-linear characteristics of the semiconductor laser 2.

In the multiplier 12, the modulation signal which has been inputted to an input terminal X and whose characteristics have been compensated by the linearity compensating circuit 13 is multiplied by the difference between the voltage value $V_0'$ and the bias voltage $V_{bias}$ which has been outputted from the arithmetic operation unit 11. A multiplication result of the multiplier 12 is supplied to the current driving circuit 7 and inputted to, for example, an input terminal on the (+) side of an amplifier 71 as an operational amplifier.

The current driving circuit 7 is constructed by, for example, the amplifier 71, resistors 72 and 74, and a transistor 73 and is a constant current circuit of a current pull-in type such that by inputting a predetermined voltage value to the input terminal on the (+) side of the amplifier 71, a predetermined current which is decided by the inputted voltage value and the resistor 74 can be extracted from a collector of the transistor 73. In the current driving circuit 7, when the voltage value which is supplied to the input terminal on the (+) side of the amplifier 71 is changed, an output current of the transistor 73 is changed in accordance with such a change.

That is, in the current pull-in type circuit, a value of the current flowing from the collector of the transistor 73 to its emitter is changed in accordance with a voltage which is applied to a base of the transistor 73. A current of a circuit connected to the collector of the transistor 73 is pulled into the transistor 73. Therefore, current $I_0'$=current $I_1$+current $I_2$ is obtained in FIG. 1.

By inputting the modulation signal to the input terminal on the (+) side of the amplifier 71, the current $I_2$ modulated by the inputted modulation signal is extracted from the collector of the transistor 73. Since current $I_0'$=current $I_1$+current $I_2$ as mentioned above, the current $I_1$ is modulated by the current $I_2$ and the semiconductor laser 2 is driven by the modulated current $I_1$.

The current $I_0'$ is a current supplied so as to have the correlation with the current $I_0$ by the current mirror circuit 9. At the same time, the semiconductor lasers 1 and 2 are thermally coupled so that their electric operation points almost coincide as mentioned above. Therefore, the emission light amount of the laser beam emitted from the semiconductor laser 2 is stably controlled on the basis of the drive current of the semiconductor laser 1. At this time, the current $I_2$ satisfies the relation current $I_0'$=current $I_1$+current $I_2$ and the current $I_0$ is not influenced by the modulation due to the modulation signal. Therefore, the output laser beam of the semiconductor laser 2 can be obtained independently of the semiconductor laser 1.

As mentioned above, according to the invention, the semiconductor laser 2 is driven by an output of the current driving circuit 7. Since the output current of the current driving circuit 7 is changed in accordance with the inputted voltage value as mentioned above, the laser beam emitted from the semiconductor laser 2 can be modulated by using an arbitrary value and an arbitrary waveform. In the cutting apparatus of a CD or a DVD, consequently, a watermark or the like can be formed. In the application of communication, since a multivalue digital signal or an analogwise signal can be modulated, those signals can be transmitted by light communication by the output laser beam of the semiconductor laser 2.

The foregoing linearity compensating circuit 13 is provided to accurately modulate those signals. Although the explanation has been made above on the assumption that the modulation signal is directly supplied to the linearity compensating circuit 13, the invention is not limited to such an example. For instance, the linearity compensating circuit 13 can be inserted between the multiplier 12 and the current driving circuit 7.

The current driving circuit 7 is not limited to the foregoing construction. For example, a D/A converter can be used as a current driving circuit 7 so long as it has the current pull-in type construction. In such a case, the laser beam emitted from the semiconductor laser 2 can be directly modulated by the D/A converter.

Figure 2:
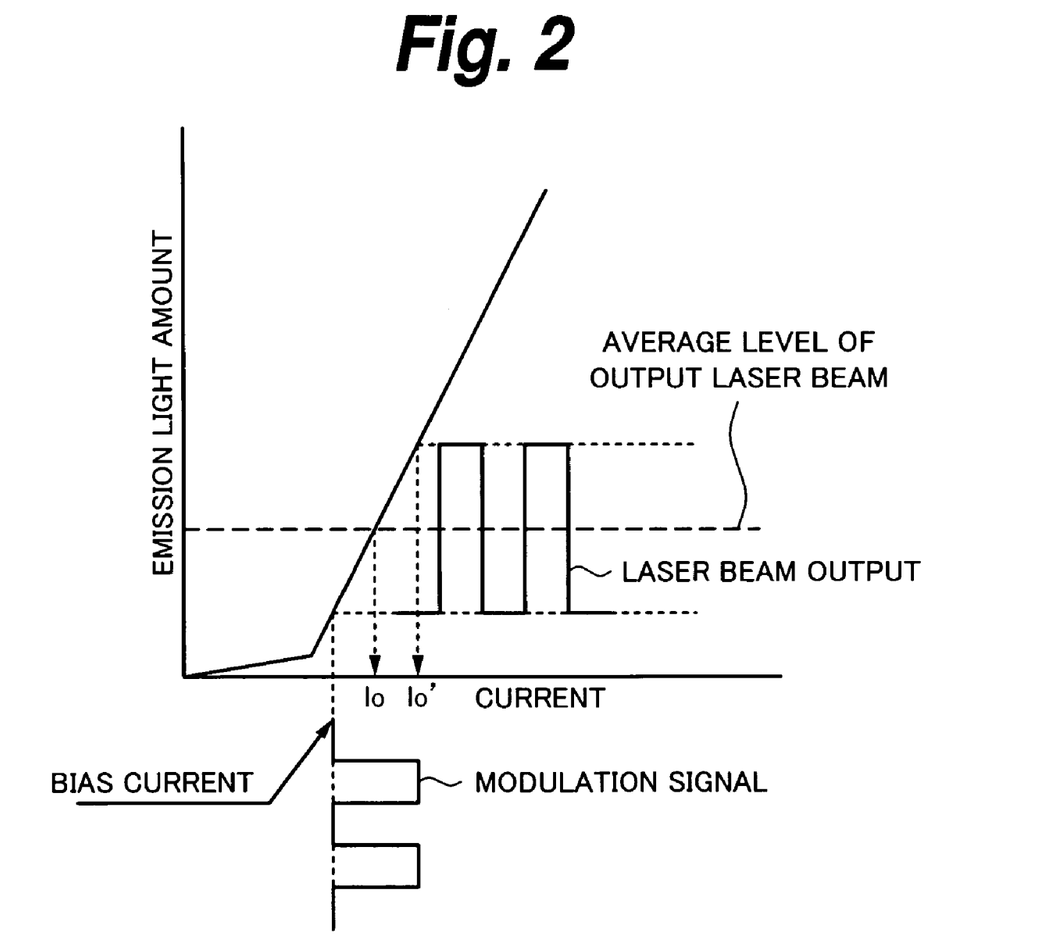
FIG. 2 shows an example of a relation of characteristics of a current of a semiconductor laser and a laser beam output.

FIG. 2 shows an example of a relation of characteristics of the current of the semiconductor laser and the laser beam output. Generally, a certain dynamic range has been predetermined for the modulation signal. The maximum laser beam output of the semiconductor laser 2 is provided by the light output setting voltage which is supplied to the current generating circuit 6 and generated when the current $I_2$=0. As an operation of the circuit, it is desirable to perform the modulation by the modulation signal having the same dynamic range irrespective of the value of the maximum laser beam output of the semiconductor laser 2.

By multiplying the modulation signal by the value obtained by subtracting the bias current shown in FIG. 2 from the current $I_0'$, the modulation signal having the same dynamic range can be obtained irrespective of the value of the maximum laser beam output of the semiconductor laser 2. In the construction of FIG. 1, the bias voltage $V_{bias}$ is set to the value corresponding to the bias current in FIG. 2, a difference between the bias voltage $V_{bias}$ and the voltage $V_0'$ which is outputted from the potential difference detecting circuit 101 and corresponding to the current $I_0'$ is obtained by the arithmetic operation unit 11, and the modulation signal is multiplied by the obtained value by the multiplier 12, thereby realizing such a construction.

When the signal modulation is continuously executed by the semiconductor laser 2, an average value of the current flowing in the semiconductor laser 2 is smaller than the current $I_0'$. Therefore, assuming that $$\text{current } I_0 = \text{current } I_0',$$

a difference between a heat generation amount of the semiconductor laser 1 and that of the semiconductor laser 2 is caused and there is a possibility that a difference of characteristics based on such a difference between the heat generation amounts is caused. Therefore, as shown in an example in FIG. 2, it is necessary to set the current mirror circuit 9 so that the value of the current $I_0$ flowing in the semiconductor laser 1 is equal to an almost average value of an amplitude of the modulation signal flowing in the semiconductor laser 2. For example, the current mirror circuit 9 is set so that the value obtained by subtracting the bias current from the current $I_0'$ is equal to almost twice as large as the value obtained by subtracting the bias current from the current $I_0$.

According to the foregoing construction, the current $I_0$ is always controlled by the feedback loop including the semiconductor laser 1 and the semiconductor laser 2 is driven on the basis of the current $I_0$. Therefore, even in the case where the burst signal is inputted as a modulation signal as described in the prior art, the emission light amount of the output laser beam which is emitted from the semiconductor laser 2 can be immediately stabilized.

Figure 3:
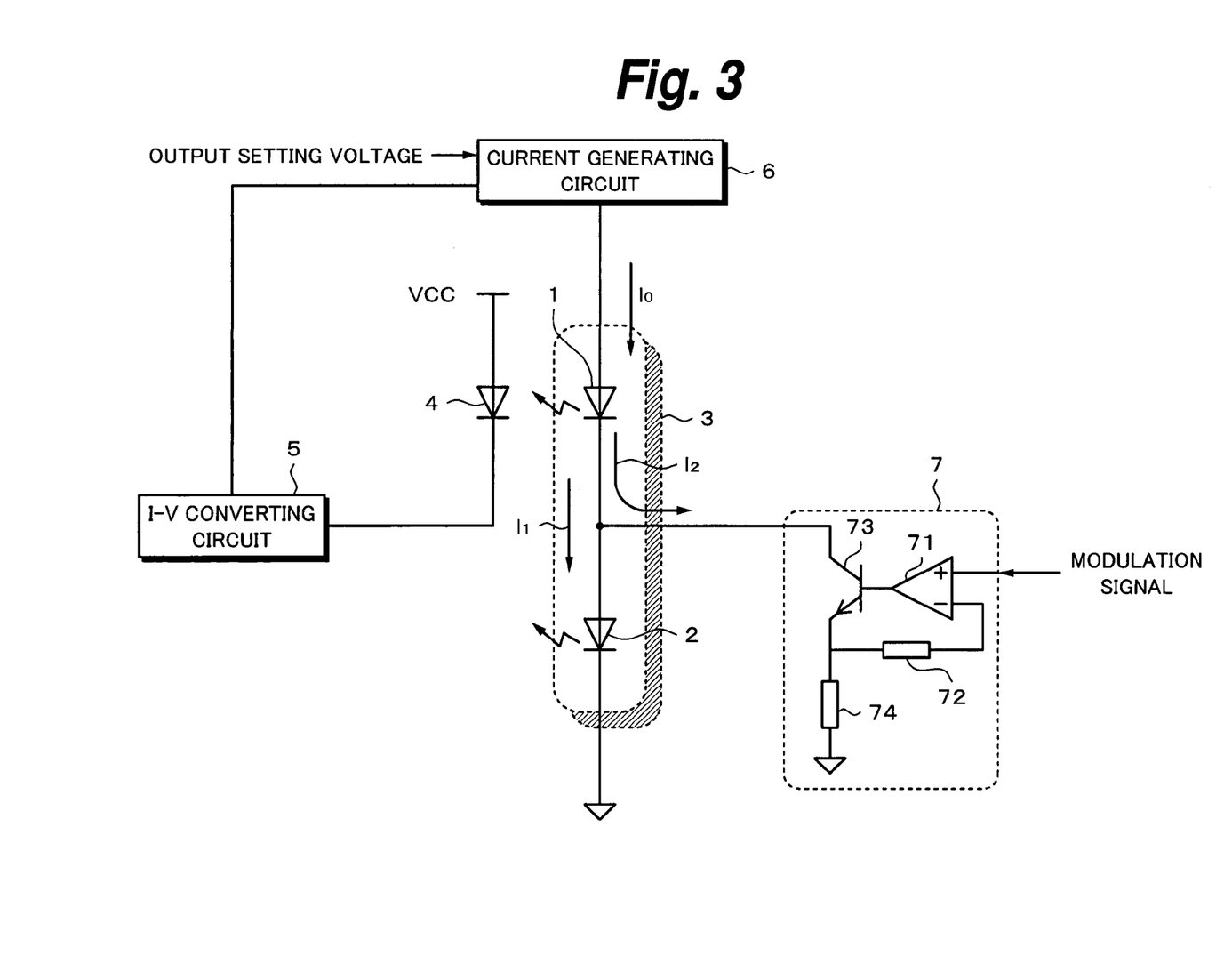
FIG. 3 is a circuit diagram showing a construction of an example of a semiconductor laser driving apparatus according to the second embodiment of the invention.

Subsequently, the second embodiment of the invention will be described. FIG. 3 schematically shows a construction of an example of a semiconductor laser driving circuit according to the second embodiment. In FIG. 3, the portions corresponding to those in FIG. 1 mentioned above are designated by the same reference numerals and their detailed description is omitted. In the second embodiment, as shown in FIG. 3, the semiconductor laser 1 to obtain a drive current serving as a reference and the semiconductor laser 2 whose output laser beam is actually modulated by the modulation signal are serially connected.

The laser beam emitted from the semiconductor laser 1 is received by the photodetector 4 and an output current according to the received laser beam is generated. The output current is converted into a voltage value by the I-V converting circuit 5. The converted voltage value is supplied to the current generating circuit 6. The light output setting voltage for setting the emission light amount of the output laser beam of the semiconductor laser 1 is also supplied to the current generating circuit 6. The current $I_0$ according to the difference between the voltage value supplied from the I-V converting circuit 5 and the value of the light output setting voltage is generated. The semiconductor laser 1 is driven by the current $I_0$. The semiconductor laser 1 is driven and controlled by a feedback loop constructed by the photodetector 4, I-V converting circuit 5, and current generating circuit 6 in a manner such that the emission light amount of the output laser beam becomes almost constant in accordance with the value of the light output setting voltage.

The current $I_0$ generated from the current generating circuit 6 drives the semiconductor laser 1 as mentioned above and is supplied to the semiconductor laser 2 thermally coupled with the semiconductor laser 1 and to the current driving circuit 7 as a constant current circuit of the current pull-in type via the semiconductor laser 1. In the current driving circuit 7, the modulation current $I_2$ according to the modulation signal supplied to the input terminal on the (+) side of the amplifier 71 is outputted from the collector of the transistor 73.

$$\text{current } I_0 = \text{current } I_1 + \text{current } I_2$$

The current $I_1$ which is supplied to the semiconductor laser 2 is modulated by the modulation current $I_2$ and the semiconductor laser 2 is driven by the current $I_1$ modulated by the modulation signal.

As mentioned above, also in the construction in which the semiconductor lasers 1 and 2 are serially connected, in a manner similar to the foregoing first embodiment, by receiving the output laser beam of the semiconductor laser 1 by the photodetector 4 and feeding it back to the current $I_0'$, the current $I_0$ is held to be constant. The semiconductor laser 2 is driven by using the current $I_0$. At this time, the current $I_1$ to drive the semiconductor laser 2 is modulated by the modulation current $I_2$ which is outputted from the current driving circuit 7 of the current pull-in type and since $$\text{current } I_0 = \text{current } I_1 + \text{current } I_2$$

the current $I_0$ is not influenced by the modulation.

In FIG. 3, the current monitor circuit 10, arithmetic operation unit 11, multiplier 12, linearity compensating circuit 13, and temperature control circuit 14 shown in FIG. 1 mentioned above are omitted.

Although the first and second embodiments of the invention have been described above with respect to the case of using the two semiconductor lasers 1 and 2, the invention is not limited to such an example. Besides the semiconductor laser 2, a further large number of semiconductor lasers can be provided as semiconductor lasers which are driven on the basis of the drive current $I_0$ of the semiconductor laser 1. The current driving circuit 7 of the current pull-in type and the like as shown in FIG. 1 or 3 mentioned above are provided for each of the further provided semiconductor lasers and the modulation by the modulation signal is made. By constructing the apparatus as mentioned above, the signal modulation can be independently performed with respect to each of a number of semiconductor lasers and a multibeam can be also realized.

Although the case where the semiconductor laser driving apparatus according to the invention is applied to the cutting apparatus of the CD or the DVD or a light communicating apparatus has been described, the invention is not limited to such an example. That is, the semiconductor laser driving apparatus according to the invention can be applied to another apparatus using the semiconductor laser for emitting the modulated laser beam.

For example, the semiconductor laser driving apparatus according to the invention can be applied to a driving apparatus for writing data onto an optical disc by using the modulated laser beam. In this case, in addition to the conventional control based on a pulse width and the number of pulses of the modulation signal, the control based on the amplitude of the modulation signal can be made, so that the recording of data onto the optical disc and the erasure of the data recorded on the optical disc can be executed at higher precision.

As described above, according to the invention, the output laser beam of the semiconductor laser can be stably and easily controlled and the output laser beam can be controlled with respect to the amplitude of the modulation signal. Therefore, when the invention is applied to the recording of the optical disc, there is an effect such that a watermark can be easily recorded.

According to the invention, since the recording of the EFM signal or a signal to display the watermark can be executed by the direct modulation to the semiconductor laser, the invention can be applied to the cutting apparatus which is used in the mastering step of the optical disc, there is no need to use the gas laser, and the AOM or the like is unnecessary, there is an effect such that the expensive optical parts can be omitted and the costs of equipment can be reduced.

According to the invention, the second semiconductor laser is driven on the basis of the current obtained by the feedback loop using the first semiconductor laser. Therefore, there is an effect such that when the invention is applied to the light communication or the like, for example, even if the burst signal is inputted as a modulation signal after a long non-signal interval, the stable output laser beam can be immediately obtained and the deterioration in error rate is prevented.

According to the invention, the output laser beam of the semiconductor laser can be modulated in accordance with the amplitude of the modulation signal which is continuously changed. There is, consequently, an effect such that when the invention is applied to the light communication or the like, high-speed analog signal communication in which a transmission waveform distortion is small can be made.

According to the invention, the intermediate value between the maximum and minimum values in the output laser beam of the semiconductor laser can be generated in accordance with the amplitude of the modulation signal. There is, consequently, an effect such that when the invention is applied to the light communication or the like, not only the signal having the conventional binary signal but also the signal having three or more values can be easily transmitted.

According to the invention, in addition to the control based on the pulse width and the number of pulses of the modulation signal, the control based on the amplitude of the modulation signal can be made with respect to the output laser beam of the semiconductor laser, so that there is an effect such that when the invention is applied to the driving apparatus for recording data onto the optical disc, the recording of the data onto the optical disc and the erasure of the data recorded on the optical disc can be executed at higher precision.

The present invention is not limited to the foregoing embodiments but many modifications and variations are possible within the spirit and scope of the appended claims of the invention.

What is claimed is:

1. A semiconductor laser driving apparatus for modulating an output laser beam of a semiconductor laser on the basis of a modulation signal and outputting the modulated laser beam, comprising:

a first semiconductor laser;

first driving means for controlling a first drive current of said first semiconductor laser on the basis of the output laser beam of said first semiconductor laser so that an emission light amount of said output laser beam becomes almost constant;

a second semiconductor laser thermally coupled with said first semiconductor laser; and second driving means for driving said second semiconductor laser by a second drive current obtained by subtracting a current corresponding to the modulation signal for modulating the output laser beam of said second semiconductor laser from a current having a correlation with said first drive current.

2. An apparatus according to claim 1, further comprising a current mirror circuit for supplying a current corresponding to said first drive current.

3. An apparatus according to claim 2, wherein the current corresponding to said second drive current is a current having a current value which is equal to or larger than said first drive current.

4. An apparatus according to claim 3, wherein the current corresponding to said second drive current is a current having a current value which is almost twice as large as said first drive current.

5. An apparatus according to claim 1, wherein said first semiconductor laser and said second semiconductor laser are serially connected and said second driving means drives said second semiconductor laser by the second drive current obtained by subtracting the current corresponding to the modulation signal for modulating the output laser beam of said second semiconductor laser from a current outputted from said first semiconductor laser.

6. An apparatus according to claim 1, wherein electrical characteristics of said first semiconductor laser and said second semiconductor laser are almost equal.

7. An apparatus according to claim 1, wherein said first semiconductor laser and said second semiconductor laser are arranged on a same mounter and thermally coupled.

8. An apparatus according to claim 1, further comprising:

temperature detecting means for detecting a temperature of said first semiconductor laser and a temperature of said second semiconductor laser; and temperature control means for controlling the temperatures of said first and second semiconductor lasers on the basis of a temperature detection result by said temperature detecting means.

* * * * *